(12) United States Patent
Kher (10) Patent No.: US 7,816,200 B2
(45) Date of Patent: Oct. 19, 2010

(54) HARDWARE SET FOR GROWTH OF HIGH K AND CAPPING MATERIAL FILMS

(75) Inventor: Shreyas Kher, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2 days.

(21) Appl. No.: 12/107,183

(22) Filed: Apr. 22, 2008

(65) Prior Publication Data

US 2009/0263961 A1 Oct. 22, 2009

(51) Int. Cl.
*H01L 21/8238* (2006.01)
(52) U.S. Cl. .................. 438/199; 438/680; 438/510; 257/E21.17; 257/E21.267; 257/E21.311; 257/E21.632
(58) Field of Classification Search .......... 438/197, 438/199, 311, 257, 287, 289, 510, 513, 680, 438/765, 768, 769, 766, 905; 257/E21.17, 257/E21.267, E21.311, E21.632
See application file for complete search history.

(56) References Cited

U.S. PATENT DOCUMENTS

| | | | | |
|---|---|---|---|---|
| 6,255,204 | B1 * | 7/2001 | Tobin et al. | 438/592 |
| 6,858,524 | B2 * | 2/2005 | Haukka et al. | 438/585 |
| 7,053,009 | B2 * | 5/2006 | Conley, Jr. et al. | 438/785 |
| 7,105,889 | B2 | 9/2006 | Bojarczuk, Jr. et al. | |
| 2005/0056216 | A1 * | 3/2005 | Kuse | 118/715 |
| 2005/0223983 | A1 * | 10/2005 | Selvamaickam et al. | 118/715 |
| 2006/0046412 | A1 * | 3/2006 | Nguyen et al. | 438/337 |

FOREIGN PATENT DOCUMENTS

| | | |
|---|---|---|
| KR | 10-2004-0100766 | 12/2004 |
| KR | 10-0476926 | 3/2005 |
| KR | 10-2006-0113556 | 11/2006 |

OTHER PUBLICATIONS

"EE410 vs. Advanced CMOS Structures", Prof. Krishna Saraswat, Department of Electrical Engineering, Stanford University.
"IBM vs. Intel: High-k Innovation", David Lammers, blog on Semiconductor International, Aug. 6, 2007.
"High-k/Metal Gates Prepare for High-Volume Manufacturing", Arghavani et al., Semiconductor International, Nov. 1, 2007.
"Band-Edge High-Performance High-k/Metal Gate MOSFETs using Cap Layers Containing Group IIA and IIIB Elements with Gate-First Processing for 45 nm and Beyond", Narayanan, et al., 2006 Symposium on VLSI Technology Digest of Technical Papers (2006).
International Search Report and Written Opinion for PCT/US2009/040276 dated Oct. 30, 2009.

* cited by examiner

*Primary Examiner*—David Nhu
(74) *Attorney, Agent, or Firm*—Patterson & Sheridan, LLP (57) ABSTRACT

The present invention generally includes a method and an apparatus for depositing both a high k layer and a capping layer within the same processing chamber by coupling gas precursors, liquid precursors, and solid precursors to the same processing chamber. By coupling gas precursors, liquid precursors, and solid precursors to the same processing chamber, a high k dielectric layer, a capping layer for a PMOS section, and a different capping layer for a NMOS may be deposited within the same processing chamber. The capping layer prevents the metal containing electrode from reacting with the high k dielectric layer. Thus, the threshold voltage for the PMOS and NMOS may be substantially identical.

20 Claims, 6 Drawing Sheets

HARDWARE SET FOR GROWTH OF HIGH K AND CAPPING MATERIAL FILMS

BACKGROUND OF THE INVENTION

1. Field of the Invention

Embodiments of the present invention generally relate to a method and apparatus for depositing both a high k layer and a capping layer within the same processing chamber.

2. Description of the Related Art

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive, e.g., feature sizes of 0.07 μm and aspect ratios of 10 or greater are being considered. Accordingly, conformal deposition of materials to form these devices is becoming increasingly important.

While conventional chemical vapor deposition (CVD) has proved successful for device geometries and aspect ratios down to 0.15 μm, the more aggressive device geometries require an alternative deposition technique. One technique that is receiving considerable attention is atomic layer deposition (ALD). During an ALD process, reactant gases are sequentially introduced into a process chamber containing a substrate. Generally, a first reactant is pulsed into the process chamber and is adsorbed onto the substrate surface. A second reactant is pulsed into the process chamber and reacts with the first reactant to form a deposited material. A purge step is typically carried out between the delivery of each reactant gas. The purge step may be a continuous purge with the carrier gas or a pulse purge between the delivery of the reactant gases.

The formation of high-k dielectric materials on complementary metal oxide semiconductor (CMOS) devices has been beneficial. However, when a metal containing electrode is utilized, the metal containing electrode may react with the high-k dielectric material and result in the threshold voltage ($V_{th}$) of the p-doped portion of the CMOS (PMOS) not matching the n-doped portion of the CMOS (NMOS). When the threshold voltages do not match, the CMOS device may not be efficient.

Therefore, there is a need in the art for a method and apparatus for making a CMOS structure utilizing both high-k dielectric material and metal containing electrodes.

SUMMARY OF THE INVENTION

The present invention generally includes a method and an apparatus for depositing both a high k layer and a capping layer within the same processing chamber by coupling gas precursors, liquid precursors, and solid precursors to the same processing chamber. In one embodiment, a complementary metal oxide semiconductor manufacturing method comprises depositing a high k layer over a substrate in a first processing chamber, depositing a first metal containing capping layer over the high k layer in the first processing chamber, and depositing a metal containing electrode layer over the first metal containing capping layer.

In another embodiment, a complementary metal oxide semiconductor manufacturing method comprises flowing a first precursor from a first liquid precursor source into a first processing chamber and depositing a first layer over a substrate, and flowing a second precursor from a solid precursor source into the first processing chamber and depositing a second layer over the first layer.

In another embodiment, a method of forming a semiconductor device comprises disposing a substrate in a first processing chamber, the substrate having a p-doped well and an n-doped well therein, depositing a high k layer over the substrate in the first processing chamber, depositing a first capping layer over the high k layer in an area over the p-doped well in the first processing chamber, and depositing a second capping layer different than the first capping layer over the high k layer in an area over the n-doped well in the first processing chamber.

In another embodiment, a vapor deposition apparatus comprises a processing chamber, one or more carrier gas sources coupled with the processing chamber, a first liquid precursor source coupled with the processing chamber and at least one of the one or more carrier gas sources, and a solid precursor source coupled with the processing chamber and at least one of the one or more carrier gas sources.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally includes a method and an apparatus for depositing both a high k layer and a capping layer within the same processing chamber by coupling gas precursors, liquid precursors, and solid precursors to the same processing chamber. By coupling gas precursors, liquid precursors, and solid precursors to the same processing chamber, a high k dielectric layer, a capping layer for a PMOS section, and a different capping layer for a NMOS may be deposited within the same processing chamber. The capping layer prevents the metal containing electrode from reacting with the high k dielectric layer. Thus, the threshold voltage for the PMOS and NMOS may be substantially identical.

Figure 1:
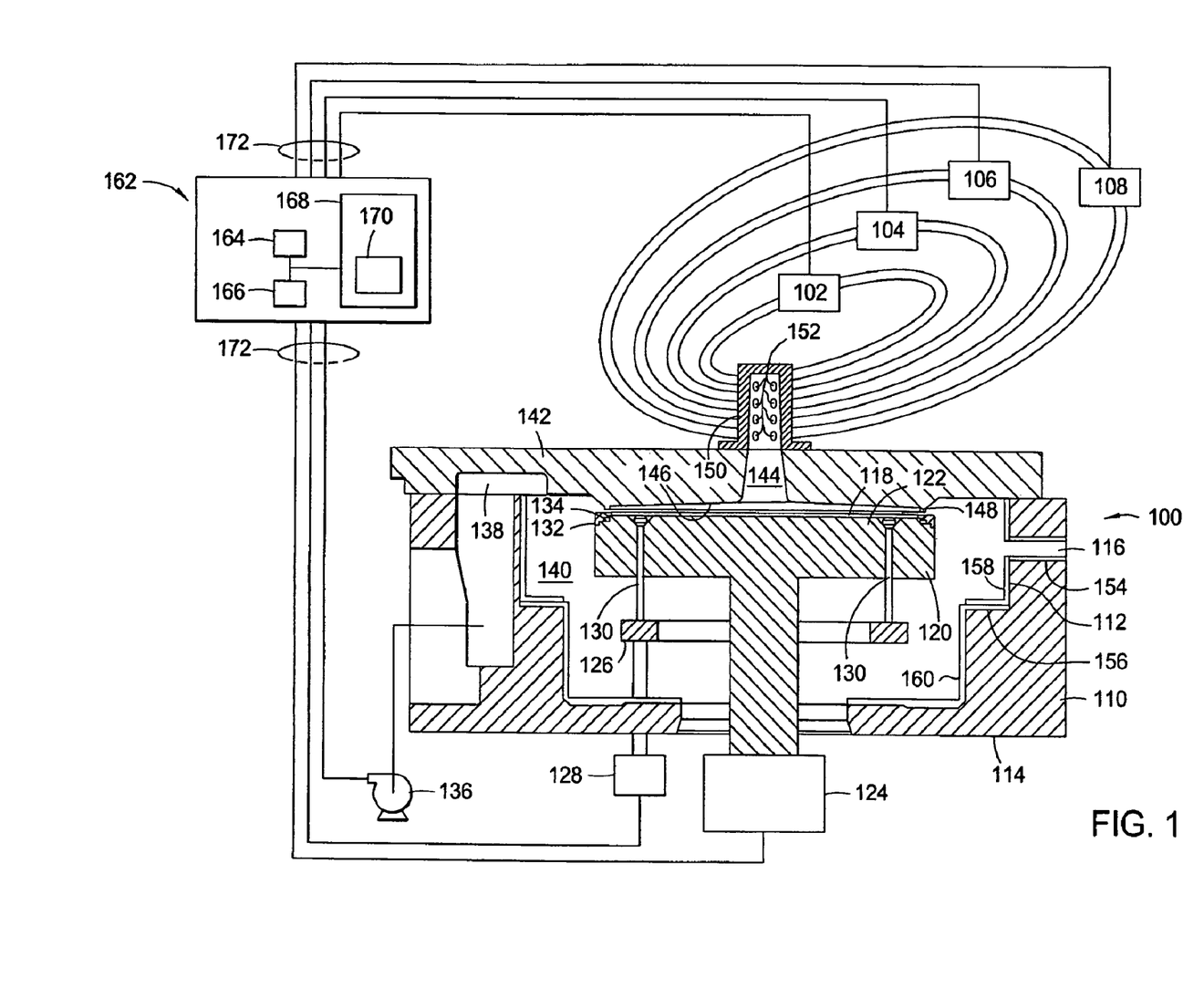
FIG. 1 is a schematic cross-sectional view of a process chamber that may be used during a deposition process according to one embodiment of the invention.

FIG. 1 is a schematic cross-sectional view of one embodiment of process chamber 100 including gas delivery apparatus 102, a first liquid delivery apparatus 104, a second liquid delivery apparatus 106, and a solid delivery apparatus 108 adapted for cyclic deposition, such as ALD or rapid CVD. In one embodiment, the first liquid delivery apparatus 104, the second liquid delivery apparatus 106, and the solid delivery apparatus 108 may share common delivery lines. The terms ALD, rapid CVD, and sequential vapor deposition as used herein refer to the sequential introduction of reactants or precursors to deposit a thin layer over a substrate structure. The sequential introduction of reactants may be repeated to deposit a plurality of thin layers to form a conformal layer to a desired thickness. In some embodiments, a reactant mixture containing more than one precursor (e.g., a hafnium precursor and a silicon precursor) may be sequentially pulsed with another precursor (e.g., water vapor). The process chamber 100 may also be adapted for other deposition techniques.

Process chamber 100 contains chamber body 110 having sidewalls 110 and bottom 114. Slit valve opening 116 in process chamber 100 provides access for a robot (not shown) to deliver and retrieve substrate 118, such as a semiconductor wafer with a diameter of 200 mm or 300 mm or a glass substrate, from process chamber 100.

Substrate support 120 supports substrate 118 on substrate receiving surface 122 in process chamber 100. Substrate support 120 is mounted to lift motor 124 to raise and lower substrate support 120 and substrate 118 disposed thereon. Lift plate 126 connected to lift motor 128 is mounted in process chamber 100 and raises and lowers pins 130 movably disposed through substrate support 120. Pins 130 raise and lower substrate 118 over the surface of substrate support 120. Substrate support 120 may include a vacuum chuck, an electrostatic chuck or a clamp ring for securing substrate 118 to substrate support 120 during a process.

Substrate support 120 may be heated to increase the temperature of substrate 118 disposed thereon. For example, substrate support 120 may be heated using an embedded heating element, such as a resistive heater, or may be heated using radiant heat, such as heating lamps disposed above substrate support 120. Purge ring 132 may be disposed on substrate support 120 to define purge channel 134 which provides a purge gas to a peripheral portion of substrate 118 to prevent deposition thereon.

Gas delivery apparatus 102, first liquid delivery apparatus 104, second liquid delivery apparatus 106, and solid delivery apparatus 108 are disposed at an upper portion of chamber body 120 to provide a fluid, such as a process fluid and/or a purge gas, to process chamber 100. Vaporized precursors are carried through the gas delivery apparatus 102, the first liquid delivery apparatus 104, the second liquid delivery apparatus, and the solid delivery apparatus 108. Vacuum system 136 is in communication with pumping channel 138 to evacuate any desired gases from process chamber 100 and to help maintain a desired pressure or a desired pressure range inside pumping zone 140 of process chamber 100.

In one embodiment, process fluid and/or purge gas enters process chamber 100 normal (i.e., 90 degrees) with respect to the plane of substrate 118 via gas delivery apparatus 102, first liquid delivery apparatus 104, second liquid delivery apparatus 106, and/or solid liquid delivery apparatus 108. Therefore, the surface of substrate 118 is symmetrically exposed to gases that allow uniform film formation on substrates. In one embodiment, the process gas may include a hafnium-containing compound (e.g., TDEAH or $HfCl_4$) during one pulse and an oxidizing gas (e.g., water vapor derived from a WVG system) in another pulse.

In one embodiment, the apparatus 100 comprises chamber lid 142. Chamber lid 142 includes expanding channel 144 extending from a central portion of chamber lid 142 and bottom surface 146 extending from expanding channel 144 to a peripheral portion of chamber lid 142. Bottom surface 146 is sized and shaped to substantially cover substrate 118 disposed on substrate support 120. Chamber lid 142 may have choke 148 at a peripheral portion of chamber lid 142 adjacent the periphery of substrate 118. Cap portion 150 includes a portion of expanding channel 144 and fluid inlets 152. Expanding channel 144 has fluid inlets 152 to provide fluid flows from the gas delivery apparatus 102, the first liquid delivery apparatus 104, the second liquid delivery apparatus, 106, and/or the solid delivery apparatus 108.

In one embodiment, chamber lid 142 is made from a metallic material such as stainless steel (e.g., iron-chromium alloys optionally containing nickel), aluminum, derivatives thereof, alloys thereof or combinations thereof. In an alternative embodiment, chamber lid 142 contains a thermally insulating material, such as fused quartz, sapphire, pyrolytic boron nitride (PBN) material, ceramic, derivatives thereof or combinations thereof. In one example, a thermally insulating liner is added to chamber lid 142 covering a substantial portion of expanding channel 144 and bottom surface 146. Preferably, expanding channel 144 and bottom surface 146 may be machined into chamber lid 142 composed of a thermally insulating material. Additional liners made from the same or a similar thermally insulating material may be added within process chamber 100. In one example, slit valve opening 116 contains liner 154, side walls 112 contain liner 156, and bottom surfaces 158 contain liner 160.

In FIG. 1, control unit 162, such as a programmed personal computer, work station computer, or the like, may be coupled to process chamber 100 to control processing conditions. For example, control unit 162 may be configured to control flow of various process fluids and purge gases from gas sources during different stages of a substrate process sequence. Illustratively, control unit 162 comprises central processing unit (CPU) 164, support circuitry 166, and memory 168 containing associated control software 170.

Control unit 162 may be one of any form of general purpose computer processor that can be used in an industrial setting for controlling various chambers and sub-processors. CPU 164 may use any suitable memory 168, such as random access memory, read only memory, floppy disk drive, compact disc drive, hard disk, or any other form of digital storage, local or remote. Various support circuits may be coupled to CPU 164 for supporting process chamber 100. Control unit 162 may be coupled to another controller that is located adjacent individual chamber components. Bi-directional communications between control unit 162 and various other components of process chamber 100 are handled through numerous signal cables collectively referred to as signal buses 172, some of which are illustrated in FIG. 1. In addition to control of process fluids and purge gases from gas delivery apparatus 102, first liquid delivery apparatus 104, second liquid delivery apparatus 106, and/or solid delivery apparatus 108, control unit 162 may be configured for automated control of other activities used in wafer processing, such as wafer transport, temperature control, chamber evacuation, among other activities, some of which are described elsewhere herein.

Figure 2A:
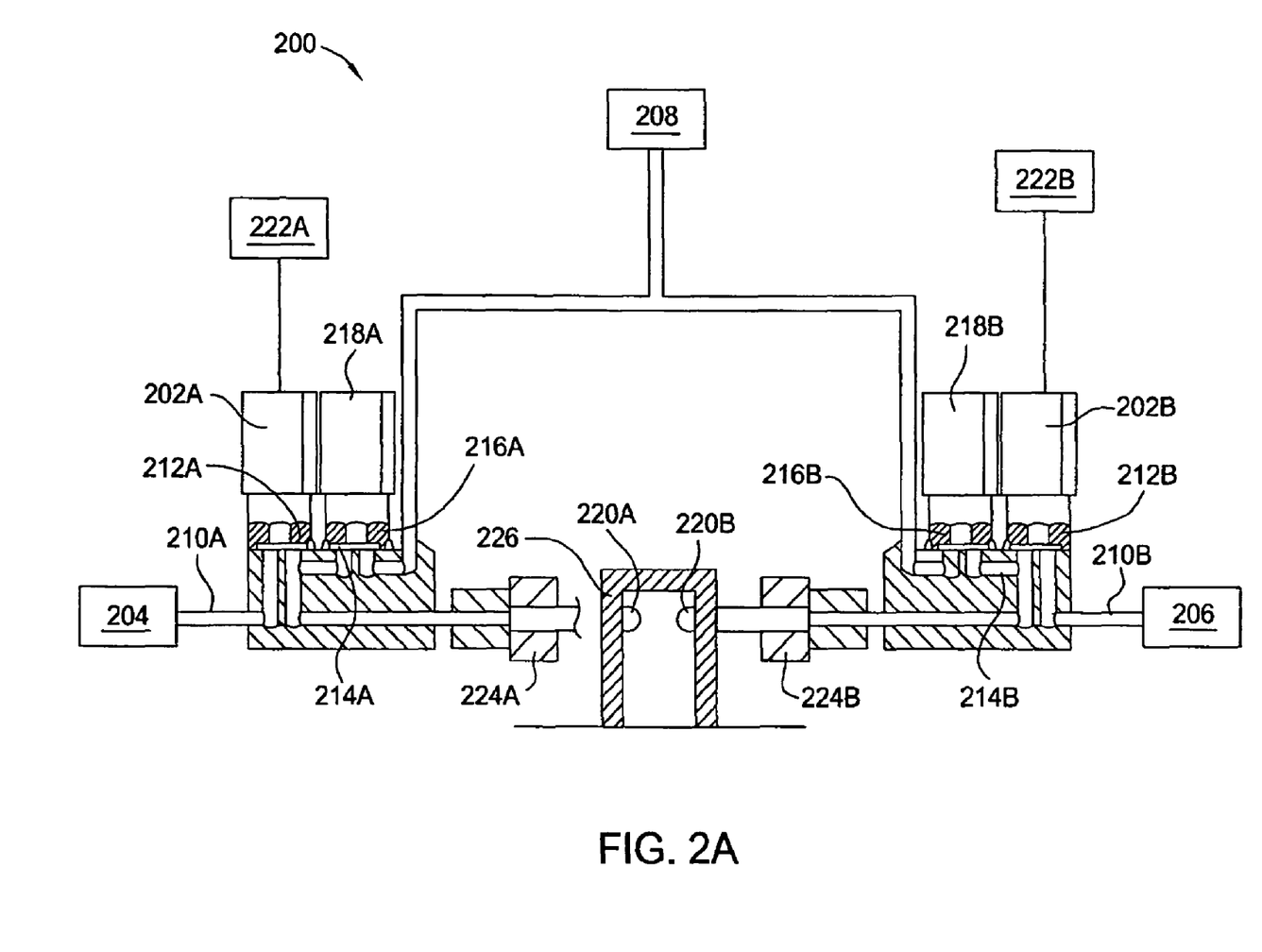
FIG. 2A is a schematic representation of a gas delivery apparatus 200 according to one embodiment of the invention.

FIG. 2A is a schematic representation of a gas delivery apparatus 200 according to one embodiment of the invention. In one configuration, valve 202A and valve 202B are coupled to separate reactant gas sources but are may be coupled to the same purge gas source. In one embodiment, each reactant gas source may have a separate, dedicated purge gas source. For example, valve 202A is coupled to reactant gas source 204 and valve 202B is coupled to reactant gas source 206, and both valves 202A, 202B are coupled to purge gas source 208. Valves 202A, 202B each include delivery line 210A, 210B having valve seat assembly 212A, 212B and includes purge line 214A, 214B having valve seat assembly 216A, 216B in fluid communication with valves 218A, 218B. Delivery line 210A, 210B is in fluid communication with reactant gas source 204, 206 and is in fluid communication with gas inlets 220A, 220B of the expanding channel 226. Valve seat assembly 212A, 212B of delivery line 210A, 210B controls the flow of the reactant gas from reactant gas sources 204, 206 to the expanding channel 226. Purge line 214A, 214B is in fluid communication with purge gas source 208 and couples with delivery line 210A, 210B downstream of valve seat assembly 212A, 212B of delivery line 210A, 210B. Valve seat assembly 216A, 216B of purge line 214A, 214B controls the flow of the purge gas from purge gas source 208 to delivery line 210A, 210B. If a carrier gas is used to deliver reactant gases from reactant gas source 204, 206, the same gas may be used as a carrier gas and a purge gas (e.g., nitrogen used as a carrier gas and a purge gas). In one embodiment, the purge gas and the carrier gas may be supplied from separate, dedicated sources.

Each valve seat assembly 212A, 212B, 216A, 216B may comprise a diaphragm and a valve seat. The diaphragm may be biased open or closed and may be actuated closed or open respectively. The diaphragms may be pneumatically actuated or may be electrically actuated. Examples of pneumatically actuated valves include pneumatically actuated valves available from Swagelok. Examples of electrically actuated valves include electrically actuated valves available from Fujikin. Programmable logic controllers 222A, 222B may be coupled to valves 202A, 202B to control actuation of the diaphragms of valve seat assemblies 212A, 212B, 216A, 216B of valves 202A, 202B. Pneumatically actuated valves may provide pulses of gases in time periods as low as about 0.020 seconds. Electrically actuated valves may provide pulses of gases in time periods as low as about 0.005 seconds. Generally pneumatically and electrically actuated valves may provide pulses of gases in time periods as high as about 3 seconds. Although higher time periods for gas pulsing is possible, a typical ALD process utilizes ALD valves to generate pulses of gas while being opened for an interval of about 5 seconds or less, preferably about 3 seconds or less, and more preferably about 2 seconds or less. In one embodiment, an ALD valve pulses for an interval in a range from about 0.005 seconds to about 3 seconds, preferably from about 0.02 seconds to about 2 seconds and more preferably from about 0.05 seconds to about 1 second. An electrically actuated valve typically requires the use of a driver coupled between the valve and the programmable logic controller.

Each valve 202A, 202B may be a zero dead volume valve to enable flushing of a reactant gas from delivery line 210A, 210B when valve seat assembly 212A, 212B of the valve is closed. For example, purge line 214A, 214B may be positioned adjacent valve seat assembly 212A, 212B of delivery line 210A, 210B. When valve seat assembly 212A, 212B is closed, purge line 214A, 214B may provide a purge gas to flush delivery line 210A, 210B. In one embodiment, warmed purge gas (e.g., about 50 degrees Celsius to about 200 degrees Celsius) is passed through to heat valve set assembly 212A, 212B in order to diminish or stop the condensation of precursors thereon, as well as within delivery lines 210A, 210B. In the embodiment shown, purge line 214A, 214B is positioned slightly spaced from valve seat assembly 212A, 212B of delivery line 210A, 210B so that a purge gas is not directly delivered into valve seat assembly 212A, 212B when open. A zero dead volume valve as used herein is defined as a valve which has negligible dead volume (i.e., not necessary zero dead volume).

Each valve 202A, 202B may be adapted to provide a combined gas flow and/or separate gas flows of reactant gas 204, 206 and purge gas 208. In reference to valve 202A, one example of a combined gas flow of reactant gas 204 and purge gas 208 provided by valve 202A comprises a continuous flow of a purge gas from purge gas source 208 through purge line 214A and pulses of a reactant gas from reactant gas source 204 through delivery line 210A. The continuous flow of the purge gas may be provided by opening the diaphragm of valve seat assembly 216A of purge line 214A. The pulses of the reactant gas from reactant gas source 204 may be provided by opening and closing the diaphragm of valve seat 212A of delivery line 210A. In reference to valve 202A, one example of separate gas flows of reactant gas 204 and purge gas 208 provided by valve 202A comprises pulses of a purge gas from purge gas source 208 through purge line 214A and pulses of a reactant gas from reactant gas source 204 through delivery line 210A. The pulses of the purge gas may be provided by opening and closing the diaphragm of valve seat assembly 216A of purge line 214A. The pulses of the reactant gas from reactant gas source 204 may be provided by opening and closing diaphragm valve seat 212A of delivery line 210A.

Delivery lines 210A, 210B of valves 202A, 202B may be coupled to gas inlets 220A, 220B through gas conduits 224A, 224B. Gas conduits 224A, 224B may be integrated or may be separate from valves 202A, 202B. In one aspect, valves 202A, 202B are coupled in close proximity to the expanding channel 226 to reduce any unnecessary volume of delivery line 210A, 210B and gas conduits 224A, 224B between valves 202A, 202B and gas inlets 220A, 220B.

Figure 2B:
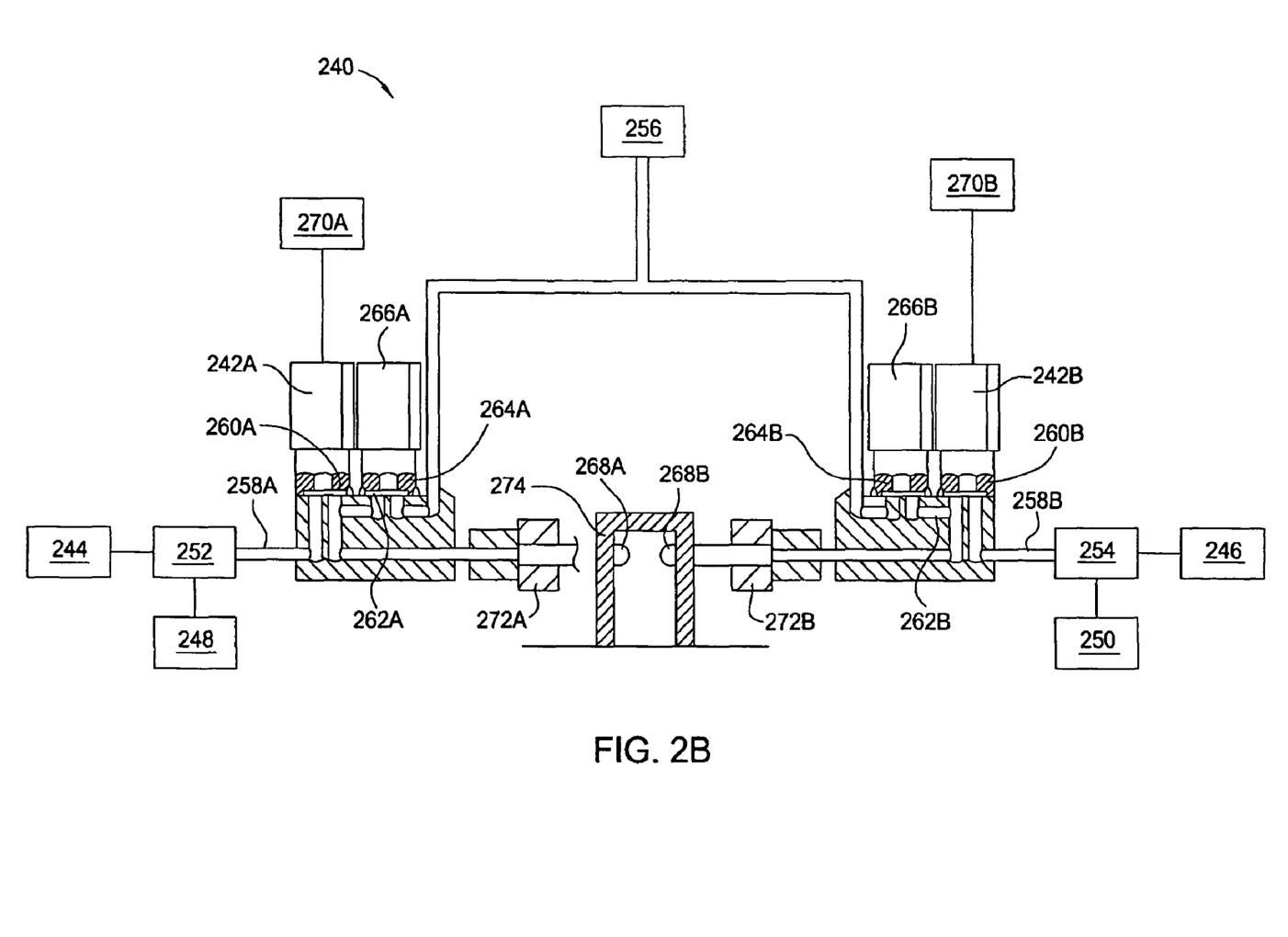
FIG. 2B is a schematic representation of a liquid delivery apparatus 240 according to one embodiment of the invention.

FIG. 2B is a schematic representation of a liquid delivery apparatus 240 according to one embodiment of the invention. In one configuration, valve 242A and valve 242B are coupled to separate liquid precursor sources but may be coupled to the same purge gas source. In one embodiment, each reactant gas source may have a separate, dedicated purge gas source. For example, valve 242A is coupled to a liquid source 248 through an evaporator 252, and valve 242B is coupled to a liquid source 250 through an evaporator 254, and both valves 242A, 242B are coupled to purge gas source 256. Valves 242A, 242B each include delivery line 258A, 258B having valve seat assembly 260A, 260B and includes purge line 262A, 262B having valve seat assembly 264A, 264B in fluid with valves 266A, 266B. A sublimiation unit may be present. Delivery line 258A, 258B is in fluid communication with liquid source 248, 250 and evaporator 252, 254 and is in fluid communication with gas inlets 268A, 268B of the expanding channel 274. Valve seat assembly 260A, 260B of delivery line 258A, 258B controls the flow from liquid sources 248, 250 to the expanding channel 274. Purge line 262A, 262B is in fluid communication with purge gas source 256 and intersects delivery line 258A, 258B downstream of valve seat assembly 260A, 260B of delivery line 258A, 258B. Valve seat assembly 264A, 264B of purge line 262A, 262B controls the flow of the purge gas from purge gas source 256 to delivery line 258A, 258B. If a carrier gas is used to deliver the evaporated liquid precursor from the evaporator 252, 254, gases from gas source 244, 246, which may be the same gas as the purge gas (e.g., nitrogen used as a carrier gas and a purge gas), may be used. In one embodiment, the purge gas and the carrier gas may be supplied from separate, dedicated sources.

Each valve seat assembly 260A, 260B, 264A, 264B may comprise a diaphragm and a valve seat as described above in regards to FIG. 2A. Programmable logic controllers 270A, 270B may be coupled to valves 242A, 242B to control actuation of the diaphragms of valve seat assemblies 260A, 260B, 264A, 264B of valves 242A, 242B. Pneumatically actuated valves may provide pulses of gases in time periods as low as about 0.020 seconds. Electrically actuated valves may provide pulses of gases in time periods as low as about 0.005 seconds. Generally pneumatically and electrically actuated valves may provide pulses of gases in time periods as high as about 3 seconds. Although higher time period for gas pulsing is possible, a typical ALD process utilizes ALD valves to generate pulses of gas while being opened for an interval of about 5 seconds or less, preferably about 3 seconds or less, and more preferably about 2 seconds or less. In one embodiment, an ALD valve pulses for an interval in a range from about 0.005 seconds to about 3 seconds, preferably from about 0.02 seconds to about 2 seconds and more preferably from about 0.05 seconds to about 1 second. An electrically actuated valve typically requires the use of a driver coupled between the valve and the programmable logic controller.

Each valve 242A, 242B may be a zero dead volume valve as discussed above in regards to FIG. 2A. Each valve 242A, 242B may be adapted to provide a combined gas flow and/or separate gas flows of evaporated liquid precursor gas 248, 250 and purge gas 256 as discussed above in regards to FIG. 2A. In reference to valve 242A, one example of a combined flow of gas and purge gas provided by valve 242A comprises a continuous flow of a purge gas from purge gas source 256 through purge line 262A and pulses of a gas from evaporator 252 through delivery line 258A. The continuous flow of the purge gas may be provided by opening the diaphragm of valve seat assembly 264A of purge line 262A. The pulses of the gas from gas source 244 may be provided by opening and closing the diaphragm of valve seat 260A of delivery line 258A. In reference to valve 242A, one example of separate gas flows of evaporated liquid precursor 248 and purge gas 256 provided by valve 242A comprises pulses of a purge gas from purge gas source 256 through purge line 262A and pulses of a liquid precursor from liquid precursor source 248 through delivery line 258A. The pulses of the purge gas may be provided by opening and closing the diaphragm of valve seat assembly 264A of purge line 262A. The pulses of the liquid precursor from liquid precursor source 248 may be provided by opening and closing diaphragm valve seat 260A of delivery line 258A.

Delivery lines 258A, 258B of valves 242A, 242B may be coupled to gas inlets 268A, 268B through gas conduits 272A, 272B. Gas conduits 272A, 272B may be integrated or may be separate from valves 242A, 242B. In one aspect, valves 242A, 242B are coupled in close proximity to the expanding channel 274 to reduce any unnecessary volume of delivery line 258A, 258B and gas conduits 272A, 272B between valves 242A, 242B and gas inlets 268A, 268B.

Figure 2C:
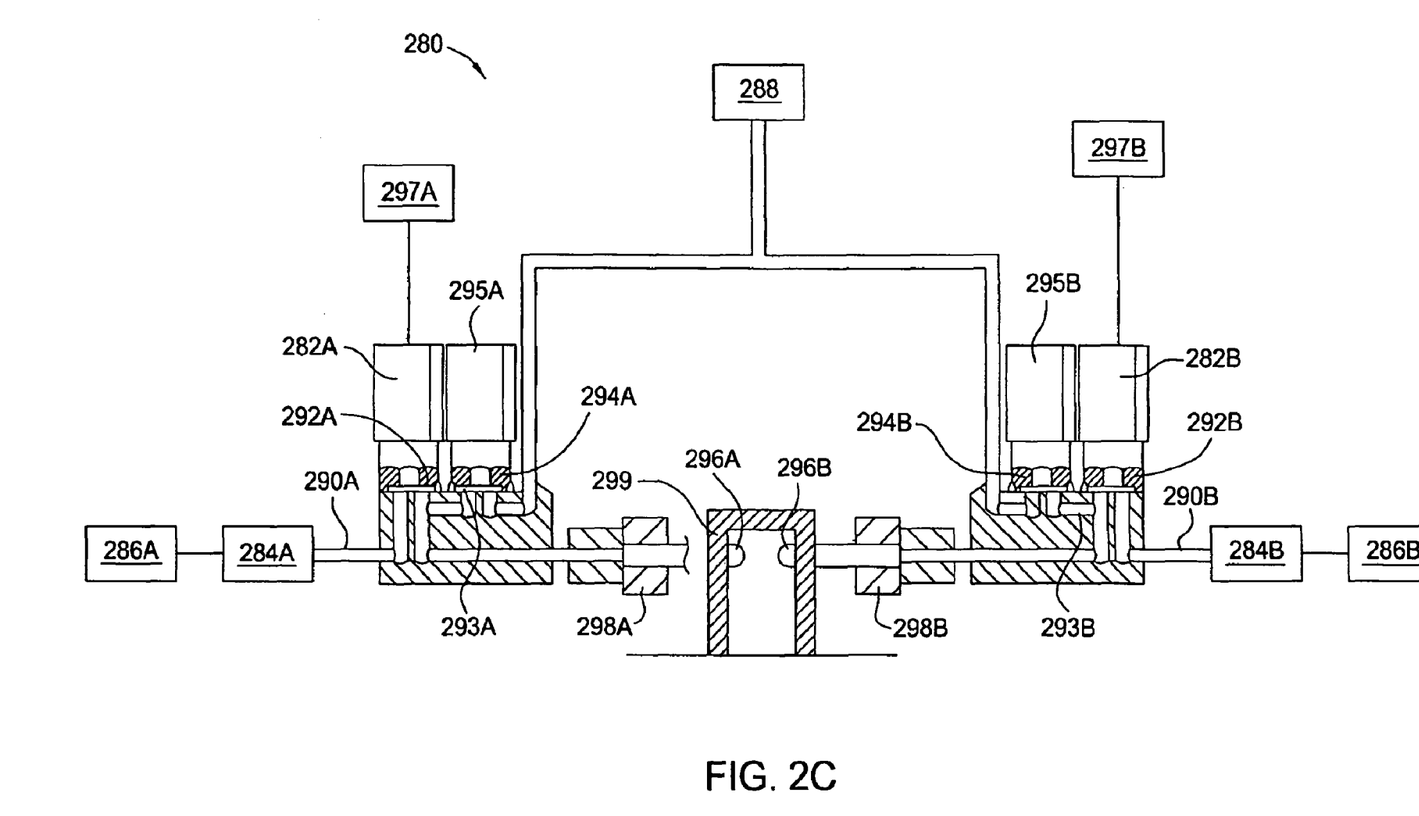
FIG. 2C is a schematic representation of a solid delivery apparatus 280 according to one embodiment of the invention.

FIG. 2C is a schematic representation of a solid delivery apparatus 280 according to one embodiment of the invention. In one configuration, valve 282A and valve 282B are coupled to separate solid precursor sources but may be coupled to the same purge gas source. In one embodiment, each reactant gas source may have a separate, dedicated purge gas source. For example, valve 282A is coupled to a sublimation unit 284A having solid precursor therein, and valve 282B is coupled to a sublimation unit 284B having solid precursor therein, and both valves 282A, 282B are coupled to purge gas source 288. A gas from a gas source 286A, 286B may flow over the solid precursor in the sublimation unit 284A, 284B to deliver the solid precursor. Valves 282A, 282B each include delivery line 290A, 290B having valve seat assembly 292A, 292B and includes purge line 293A, 293B having valve seat assembly 294A, 294B in fluid with valves 295A, 295B. Delivery line 290A, 290B is in fluid communication with sublimation unit 284A, 284B and is in fluid communication with gas inlets 296A, 296B of the expanding channel 299. Valve seat assembly 292A, 292B of delivery line 290A, 290B controls the flow of the gas from the sublimation unit 284A, 284B to the expanding channel 299. Purge line 293A, 293B is in fluid communication with purge gas source 288 and intersects delivery line 290A, 290B downstream of valve seat assembly 292A, 292B of delivery line 290A, 290B. Valve seat assembly 294A, 294B of purge line 293A, 293B controls the flow of the purge gas from purge gas source 288 to delivery line 290A, 290B. The gas from the gas source 286A, 286B that carries the solid precursor from the sublimation unit 284A, 284B may be the same gas as the purge gas (e.g., nitrogen used as a carrier gas and a purge gas). In one embodiment, the purge gas and the carrier gas may be supplied from separate, dedicated sources.

Each valve seat assembly 292A, 292B, 294A, 294B may comprise a diaphragm and a valve seat as described above in regards to FIG. 2A. Programmable logic controllers 298A, 298B may be coupled to valves 282A, 282B to control actuation of the diaphragms of valve seat assemblies 292A, 292B, 294A, 294B of valves 282A, 282B. Pneumatically actuated valves may provide pulses of gases in time periods as low as about 0.020 seconds. Electrically actuated valves may provide pulses of gases in time periods as low as about 0.005 seconds. Generally pneumatically and electrically actuated valves may provide pulses of gases in time periods as high as necessary. In one embodiment, the pulse may be about 3 seconds. Although higher time period for gas pulsing is possible, a typical ALD process utilizes ALD valves to generate pulses of gas while being opened for an interval of about 5 seconds or less, preferably about 3 seconds or less, and more preferably about 2 seconds or less. In one embodiment, an ALD valve pulses for an interval in a range from about 0.005 seconds to about 3 seconds, preferably from about 0.02 seconds to about 2 seconds and more preferably from about 0.05 seconds to about 1 second. An electrically actuated valve typically requires the use of a driver coupled between the valve and the programmable logic controller.

Each valve 282A, 282B may be a zero dead volume valve as discussed above in regards to FIG. 2A. Each valve 282A, 282B may be adapted to provide a combined gas flow and/or separate gas flows of sublimated solid precursor and purge gas 256 as discussed above in regards to FIG. 2A. In reference to valve 282A, one example of a combined flow of provided by valve 282A comprises a continuous flow of a purge gas from purge gas source 288 through purge line 293A and pulses of a gas through delivery line 290A. The continuous flow of the purge gas may be provided by opening the diaphragm of valve seat assembly 294A of purge line 293A. The pulses from the sublimation unit 294A may be provided by opening and closing the diaphragm of valve seat 292A of delivery line 290A. In reference to valve 282A, one example of separate gas flows of sublimed solid precursor and purge gas 288 provided by valve 282A comprises pulses of a purge gas from purge gas source 288 through purge line 293A and pulses from sublimation unit 284A through delivery line 290A. The pulses of the purge gas may be provided by opening and closing the diaphragm of valve seat assembly 294A of purge line 293A. The pulses from the sublimation unit 284A may be provided by opening and closing diaphragm valve seat 292A of delivery line 290A.

Delivery lines 290A, 290B of valves 282A, 282B may be coupled to gas inlets 296A, 296B through gas conduits 298A, 298B. Gas conduits 298A, 298B may be integrated or may be separate from valves 282A, 282B. In one aspect, valves 282A, 282B are coupled in close proximity to the expanding channel 299 to reduce any unnecessary volume of delivery line 290A, 290B and gas conduits 298A, 298B between valves 282A, 282B and gas inlets 296A, 296B.

Figure 3:
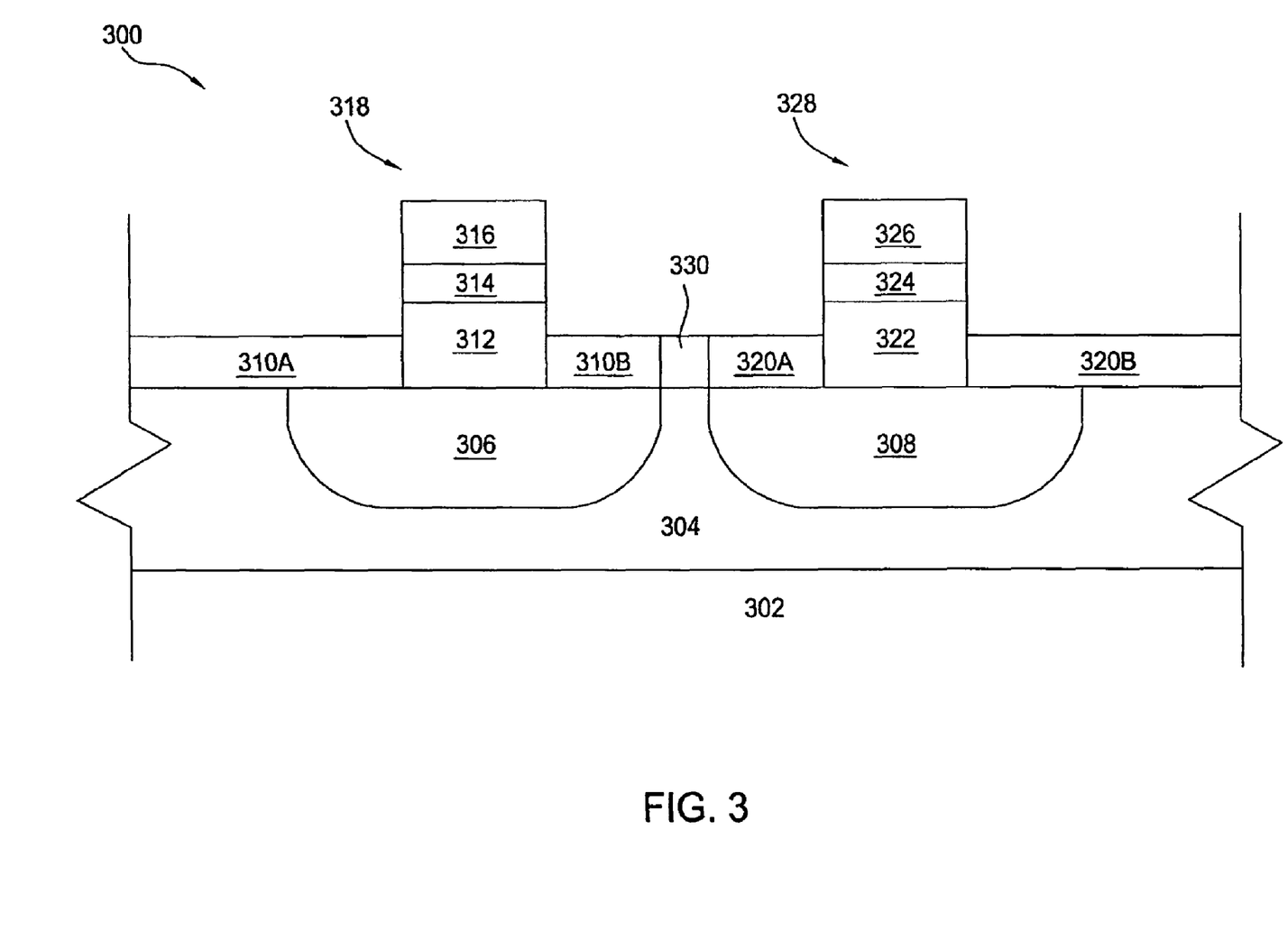
FIG. 3 is a schematic drawing of a CMOS structure 300 according to one embodiment of the invention.

The above described apparatus may be used to form a CMOS structure wherein high k layer, the capping layer, and the metal gate electrode layer may be deposited within the same processing chamber. FIG. 3 is a schematic drawing of a CMOS structure 300 according to one embodiment of the invention. The CMOS structure 300 may comprise a substrate 302 having an epitaxial layer 304 deposited thereover. Within the epitaxial layer 304, a p-well 306 and an n-well 308 may be formed. Over the p-well 306, an NMOS structure 318 may be formed. The NMOS structure 318 may comprise a source electrode 310A, a drain electrode 310B, a high k layer 312, a capping layer 314, and a gate electrode 316. Similarly, a PMOS structure 328 may be formed over the n-well 308. The PMOS structure 328 may comprise a source electrode 320A, a drain electrode 320B, a high k layer 322, a capping layer 324, and a gate electrode 326. The NMOS structure 318 may be isolated from the PMOS structure 328 by an isolation region 330.

The capping layers 314, 324 may be present between the high k layers 312, 322 and the gate electrodes 316, 326 to prevent the gate electrodes 316, 326 from reacting with the high k layers 312, 322. The capping layers 314, 324 may tune the threshold voltage. In one embodiment, the capping layer 314 in the NMOS structure 318 is different than the capping layer 324 of the PMOS structure 328.

Figure 4:
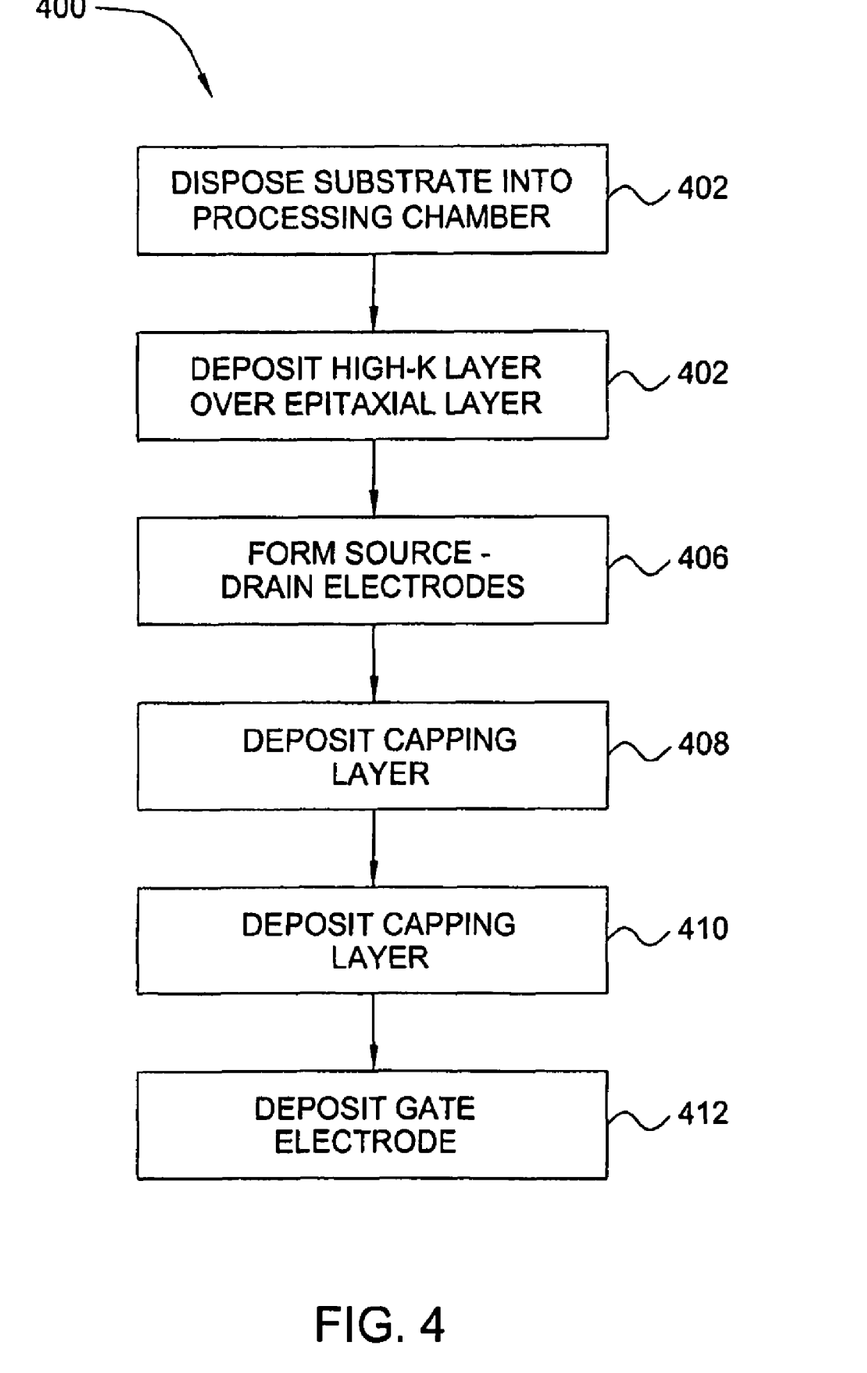
FIG. 4 is a flow chart 400 of a CMOS fabrication process according to one embodiment of the invention.

FIG. 4 is a flow chart 400 of a CMOS fabrication process according to one embodiment of the invention. The CMOS structure 300 may be formed by disposing a substrate 302 having an epitaxial layer 304 including a p-well 306 and an n-well 308 into a processing chamber (Step 402). In one embodiment, the epitaxial layer 304, the p-well 306, and the n-well 308 may be disposed over the substrate 302 within the same processing chamber. A high k dielectric layer may then be deposited over the epitaxial layer 304 (Step 404). In one embodiment, the high k layer is blanket deposited over the epitaxial layer and then pattern etched to form the high k layers 312, 322. In another embodiment, the high k layers 312, 322 may be pattern deposited separately. The high k dielectric layers 312, 322 may comprise a high k material such as $HfO_2$, HfSiO, $Pr_2O_3$, $La_2O_5$, $ZrO_2$, ZrSiO, $Al_2O_3$, LaAlO, $Ta_2O_5$, Ta(Al)$O_5$, Ta(Ti)$O_5$, and combinations thereof. The high k layers 312, 322 may be deposited by ALD, CVD, thermal ALD, thermal CVD, plasma enhanced CVD, or plasma enhanced ALD.

Once the high k layers 312, 322 are formed, the source 310A, 320A and drain electrodes 310B, 320B may be formed with an isolation region 330 therebetween (Step 406). In one embodiment, the source 310A, 320A and drain electrodes 310B, 320B may be formed prior to the high k layers 312, 322.

Over the high k layers 312, 322, capping layers 314, 324 may be deposited. The capping layers 314, 324 may comprise a material selected from the group consisting of aluminum oxide and lanthanum oxide, yttrium oxide, scandium oxide, gadolinium oxide, dysprosium oxide, and other metal oxides. In one embodiment, the capping layer 314 may comprise aluminum oxide and capping layer 324 may comprise lanthanum oxide. The capping layer 314 of the NMOS structure 318 may be pattern deposited over the high k layer 312 (Step 408). In one embodiment, the capping layer 314 may be blanket deposited over the substrate, including the PMOS structure 328, and then etched back to remove the capping layer 314 from all locations except for the NMOS structure 318. Thereafter, the capping layer 324 may be pattern deposited over the high k layer 322 (Step 410). In one embodiment, the capping layer 324 may be formed by doping an aluminum oxide layer with lanthanum. The capping layers 314, 324 may be deposited within the same processing chamber as high k layers 312, 322. In one embodiment, the capping layers 314, 324 may have a thickness between about 5 Angstroms and about 15 Angstroms. The capping layers 314, 324 may be deposited in either order.

The capping layers 314, 324 may permit the threshold voltage for the PMOS structure 328 and the NMOS structure 318 to match. The capping layers 314, 324 may react with the high k layers 312, 322 at the interface. When no capping layer is present, the gate electrodes react with the high k layers and thus, the threshold voltages for the PMOS and NMOS structures may not match. When the NMOS structure and the PMOS structure have the same magnitude, but different sign (i.e., +1 V and −1 V), the NMOS structure and the PMOS structure may turn on simultaneously. Thus, the CMOS structure may be more efficient.

After the capping layers 314, 324 have been deposited, the gate electrodes 316, 326 may be deposited (Step 412). In one embodiment, the gate electrodes 316, 326 comprise the same material. In another embodiment, the gate electrodes 316, 326 may comprise different material. When the same material is used for the gate electrodes 316, 326, the gate electrode material may be blanket deposited and then patterned to leave the gate electrodes 316, 326. In one embodiment, the gate electrodes 316, 326 may comprise a material selected from the group consisting of TaN, TiN, Ru, Pt, TiAlN, HfN, and other films such as polysilicon, SiN, and high temperature oxides (HTO). In one embodiment, the gate electrodes 316, 326 comprise a metal selected from the group consisting of tantalum, titanium, ruthenium, platinum, aluminum, hafnium, and combinations thereof.

The CMOS structure 300 described above may have the high k layers 312, 322, the capping layers 314, 324, and the gate electrodes 316, 326 deposited within the same processing chamber such as the processing chamber shown in FIG. 1. Between any of the depositions steps described above, the CMOS structure 300 may be annealed. Additionally, the deposition may occur in a highly oxidizing, high temperature atmosphere (i.e., about 150 degrees Celsius to about 800 degrees Celsius) such as a plasma atmosphere.

Because the high k layers, capping layers, and gate electrodes for both PMOS and NMOS structures within a CMOS structure may be deposited within the same processing chamber, the processing chamber permits deposition utilizing gaseous precursors, liquid precursors, and solid precursors, either alone or in combination, to deposit the layers. Exemplary solid precursors that may be utilized include solid flammable precursors such as $HfCl_4$, $ZrCl_4$, TDEAZ, TDMAZ, TEMAZ, lanthanum precursors, tetrakis-dimethylamino hafnium (TDMAH), and combinations thereof. Viscous and pyrophoric precursors may also be utilized including trimethyl aluminum, dimethyl aluminum, other organo-aluminum compounds, and combinations thereof. Flammable liquid precursors that may be utilized include tetrakis (diethylamino)hafnium (TDEAH), tetrakis-ethylmethylamino hafnium (TEMAH), tetrakis (dimethylamino) silane (4-DMAS), tris[dimethylamino] silane (3-DMAS), tetrakis(diethylamino) silane (TDEAS), tetrakis-ethylmethylamino silane (TEMAS), bis-tertbutylaminosilane (BTBAS), and combinations thereof. Pyrophoric, toxic, or reactive gas precursors may also be utilized including $AsH_3$, $GeH_3$, $SiH_4$, $NH_3$, $PH_3$, $Si_2H_6$, $B_2H_6$, dichlorosilane, hexachlorosilane, $N_2O$, and combinations thereof.

The invention described herein permits the high k layer, the capping layer, and the metal gate layer to be deposited within the same chamber. Specifically, the high k layer for the PMOS, the high k layer for the NMOS, the capping layer for the PMOS, the capping layer for the NMOS, the electrode for the PMOS, and the electrode for the NMOS may all be deposited within the same processing chamber. Additionally, the high k layer for the NMOS structure and the PMOS structure may be the same, and the electrode layer for the NMOS structure and the PMOS structure may be the same. The capping layer for the NMOS structure and the capping layer for the PMOS structure may be different. In the deposition process, one or more gaseous precursors, one or more liquid precursors, and one or more solid precursors may be delivered to the same processing chamber either independently or simultaneously. The precursors may be independently delivered or, in one embodiment, co-flowed.

By providing liquid, gaseous, and solid precursors to the same processing chamber, deposition of a high k layer, a capping layer, and an electrode layer may occur within the same processing chamber. By depositing the layers within the same processing chamber, contamination of the CMOS structure may be reduced and throughput may be increased.

While the foregoing is directed to embodiments of the present invention, other and further embodiments of the invention may be devised without departing from the basic scope thereof, and the scope thereof is determined by the claims that follow.

The invention claimed is:

1. A complementary metal oxide semiconductor (CMOS) manufacturing method, comprising:
    disposing a substrate in a processing chamber, the substrate having a p-doped well and an n-doped well therein;
    depositing a high k layer over the substrate in the processing chamber, wherein depositing the high k layer comprises flowing a precursor into the processing chamber from a first liquid precursor source;
    depositing a first capping layer over the high k layer in an area over the p-doped well in the processing chamber, wherein depositing the first capping layer comprises flowing a second precursor into the processing chamber from a second liquid precursor source different than the first liquid precursor source; and
    depositing a second capping layer different than the first capping layer over the high k layer in an area over the n-doped well in the processing chamber.

2. The CMOS manufacturing method according to claim 1, wherein depositing the second capping layer comprises flowing a third precursor into the processing chamber from a first solid precursor source.

3. The CMOS manufacturing method according to claim 2, wherein the third precursor is co-flowed with a carrier gas.

4. The CMOS manufacturing method according to claim 2, wherein the third precursor is flowed simultaneously with the second precursor.

5. The CMOS manufacturing method according to claim 1, wherein the second liquid precursor and the solid precursor are simultaneously flowed into the processing chamber.

6. The CMOS manufacturing method according to claim 1, further comprising annealing after flowing the second precursor into the processing chamber.

7. The CMOS manufacturing method according to claim 1, further comprising removing a portion of the first capping layer over the high k layer in the area over the n-doped well.

8. The CMOS manufacturing method according to claim 7, wherein depositing the second capping layer comprises flowing a precursor into the processing chamber from a first solid precursor source.

9. The CMOS manufacturing method according to claim 1, wherein depositing the second capping layer comprises introducing a dopant into the first capping layer.

10. The CMOS manufacturing method according to claim 1, further comprising depositing a first metal containing electrode layer over the first capping layer.

11. The CMOS manufacturing method according to claim 10, further comprising depositing a second metal containing electrode layer over the second capping layer.

12. The CMOS manufacturing method according to claim 11, wherein the first metal containing electrode layer and the second metal containing electrode layer are deposited simultaneously.

13. The CMOS manufacturing method according to claim 11, wherein the first metal containing electrode layer and the second metal containing electrode layer are substantially identical.

14. A method of manufacturing a complementary metal oxide semiconductor (CMOS), comprising:
    disposing a substrate in a processing chamber, the substrate having a p-doped well and an n-doped well therein;
    depositing a dielectric layer over the substrate in the processing chamber, wherein depositing the dielectric layer comprises flowing a precursor into the processing chamber from a first liquid precursor source;
    depositing a first capping layer over the dielectric layer in an area over the p-doped well in the processing chamber, wherein depositing the first capping layer comprises flowing a second precursor into the processing chamber from a second liquid precursor source different than the first liquid precursor source; and
    depositing a second capping layer different than the first capping layer over the dielectric layer in an area over the n-doped well in the processing chamber.

15. The method of manufacturing a CMOS according to claim 14, wherein depositing the second capping layer comprises flowing a third precursor into the processing chamber from a first solid precursor source.

16. The method of manufacturing a CMOS according to claim 15, wherein the third precursor is co-flowed with a carrier gas.

17. The method of manufacturing a CMOS according to claim 15, wherein the third precursor is flowed simultaneously with the second precursor.

18. The method of manufacturing a CMOS according to claim 14, further comprising removing a portion of the first capping layer over the dielectric layer in the area over the n-doped well.

19. The method of manufacturing a CMOS according to claim 14, wherein depositing the second capping layer comprises introducing a dopant into the first capping layer.

20. The method of manufacturing a CMOS according to claim 14, further comprising depositing a first metal containing electrode layer over the first capping layer.

* * * * *